(12) United States Patent
Nagamine et al.

(10) Patent No.: US 10,863,625 B2
(45) Date of Patent: Dec. 8, 2020

(54) FLEXIBLE PRINTED CIRCUIT BOARD AND JOINED BODY

(71) Applicant: Mitsubishi Electric Corporation, Tokyo (JP)

(72) Inventors: Takumi Nagamine, Tokyo (JP); Yoichi Kitamura, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/607,497

(22) PCT Filed: Apr. 19, 2018

(86) PCT No.: PCT/JP2018/016065
§ 371 (c)(1),
(2) Date: Oct. 23, 2019

(87) PCT Pub. No.: WO2018/203481
PCT Pub. Date: Nov. 8, 2018

(65) Prior Publication Data
US 2020/0146150 A1   May 7, 2020

(30) Foreign Application Priority Data

May 1, 2017   (JP) .................................. 2017-091163

(51) Int. Cl.
*H05K 1/02* (2006.01)
*H05K 1/09* (2006.01)
(Continued)

(52) U.S. Cl.
CPC ........... *H05K 1/148* (2013.01); *H05K 1/0281* (2013.01); *H05K 3/22* (2013.01); *H05K 3/363* (2013.01)

(58) Field of Classification Search
CPC ... H05K 1/02; H05K 1/09; H05K 1/11; H05K 1/111; H05K 3/00; H05K 3/30; H05K 3/36; H05K 3/323; H05K 3/4691
(Continued)

(56) References Cited

U.S. PATENT DOCUMENTS

2005/0161832 A1   7/2005  Saeki
2008/0099230 A1*  5/2008  Takahashi ............ H05K 3/4691
                                                            174/250
(Continued)

FOREIGN PATENT DOCUMENTS

JP      S61111173 U    7/1986
JP      S63314884 A    12/1988
(Continued)

OTHER PUBLICATIONS

International Search Report (with English Translation) and Written Opinion issued in corresponding International Patent Application No. PCT/JP2018/016065, 10 pages (dated Jul. 3, 2018).
(Continued)

*Primary Examiner* — Xiaoliang Chen
(74) *Attorney, Agent, or Firm* — Buchanan Ingersoll & Rooney PC

(57) ABSTRACT

A flexible printed circuit board includes: a base material including a principal face; at least one first wiring pattern disposed on the principal face of the base material and extending along a first direction; and a first member and a second member disposed on the first wiring pattern so as to be spaced from each other in the first direction. In the first direction, the first member and the second member divide the flexible printed circuit board into: a first region located opposite to the second member with respect to the first member in the first direction, a second region located between the first member and the second member, a third
(Continued)

region located opposite to the first member with respect to the second member, a fourth region in which the first member is disposed, and a fifth region in which the second member is disposed.

13 Claims, 10 Drawing Sheets

(51) Int. Cl.
*H05K 1/11* (2006.01)
*H05K 3/00* (2006.01)
*H05K 3/30* (2006.01)
*H05K 3/36* (2006.01)
*H05K 1/14* (2006.01)
*H05K 3/22* (2006.01)

(58) Field of Classification Search
USPC .................. 361/749; 174/250, 252, 257, 261
See application file for complete search history.

(56) References Cited

U.S. PATENT DOCUMENTS

| | | | |
|---|---|---|---|
| 2015/0103500 A1* | 4/2015 | Bae | ........................ H01L 24/06 361/749 |
| 2015/0243798 A1* | 8/2015 | Woo | ..................... H01L 31/0516 136/244 |
| 2016/0095207 A1* | 3/2016 | Taniguchi | ............ H05K 3/4691 174/252 |
| 2017/0135209 A1* | 5/2017 | Kim | ......................... H05K 1/09 |
| 2017/0309646 A1* | 10/2017 | Son | ........................ G06F 1/1643 |

FOREIGN PATENT DOCUMENTS

| | | |
|---|---|---|
| JP | H07170047 A | 7/1995 |
| JP | H0997967 A | 4/1997 |
| JP | 2001284747 A | 10/2001 |
| JP | 2005191422 A | 7/2005 |
| JP | 2006066525 A | 3/2006 |
| JP | 2007250884 A | 9/2007 |
| JP | 2011009406 A | 1/2011 |
| JP | 2015012072 A | 1/2015 |

OTHER PUBLICATIONS

Notice of Reasons for Refusal dated Aug. 4, 2020, by the Japan Patent Office in corresponding Japanese Patent Application No. 2019-515696 and an English translation of the Notice. (11 pages).

\* cited by examiner

FLEXIBLE PRINTED CIRCUIT BOARD AND JOINED BODY

TECHNICAL FIELD

The present invention relates to a flexible printed circuit board and a joined body including the flexible printed circuit board; particularly to a flexible printed circuit board used as a wiring member in an electronic device, and a joined body with the flexible printed circuit board connected as a wiring member.

BACKGROUND ART

An electronic device typically includes a power circuit to supply driving power, and a control circuit to transmit digital signals. These electronic circuits are mounted on a printed circuit board for use, the printed circuit board including electronic components (e.g., ICs) and metal conductors that connect the electronic components. In some cases, these electronic circuits are mounted on a single printed circuit board. However, in many cases, the electronic circuits are mounted on a plurality of printed circuit boards for use for preventing circuit noise. In the latter case, the printed circuit boards are electrically connected via interconnections.

As an example of the interconnection, wire harnesses may be used. In this case, the wire harnesses are used in combination with connectors for the wire harnesses, thus making it difficult to downsize the electronic device.

As another example of the interconnection, flexible printed circuit boards (flexible printed circuits, hereinafter referred to as FPCs) may be used. In this case, the above-described problem caused by the wire harnesses is overcome.

A technique is known in which a flexible printed circuit board has a non-bendable region to be connected to another printed circuit board, and a bendable region which is flexed more than the non-bendable region. In this technique, the bendable region can absorb the strain at connection portions between the component parts having different coefficients of linear expansion, the strain being caused by, for example, the heat generated by the operation of the electronic device, and the changes of temperature in the use environment.

Japanese Patent Laying-Open No. 2007-250884 (PTL 1) discloses a flexible printed circuit board having a bendable region and a non-bendable region, where the non-bendable region has more residue of conductive layer than the bendable region. In PTL 1, for each of the bendable region and the non-bendable region, the residue of conductor layer is controlled by each step of plating, masking, and etching.

CITATION LIST

Patent Literature

PTL 1: Japanese Patent Laying-Open No. 2007-250884

SUMMARY OF INVENTION

Technical Problem

However, in the flexible printed circuit board described in Japanese Patent Laying-Open No. 2007-250884, the bendable region adjoins the non-bendable region and has a uniform configuration in the adjoining direction. Accordingly, when receiving the above-described strain, the bendable region is deformed into a uniform, smaller curvature in the adjoining direction. With a typical material, the flex resistance is decreased as the radius of curvature is decreased.

A main object of the present invention is to provide a flexible printed circuit board higher in flex resistance than a conventional flexible printed circuit board, and to provide a joined body including such a flexible printed circuit board.

Solution to Problem

A flexible printed circuit board according to the present invention comprises: a base material including a principal face; at least one first wiring pattern disposed on the principal face of the base material and extending along a first direction; and a first member and a second member disposed on the first wiring pattern so as to be spaced from each other in the first direction. In the first direction, the first member and the second member divide the flexible printed circuit board into at least a first region located opposite to the second member with respect to the first member in the first direction, a second region located between the first member and the second member, a third region located opposite to the first member with respect to the second member, a fourth region in which the first member is disposed, and a fifth region in which the second member is disposed. The thickness including the base material and the first wiring pattern in the second region is smaller than the thickness including the base material, the first wiring pattern, and the first member in the fourth region, and is smaller than the thickness including the base material, the first wiring pattern, and the second member in the fifth region.

Advantageous Effects of Invention

The flexible printed circuit board of the present invention includes a first joining member on the first region located opposite to the second member with respect to the first member. Accordingly, at least a part of the first region can be joined to another member, such as a printed circuit board, via the first joining member. Further, the flexible printed circuit board of the present invention includes the first member and the second member. Accordingly, the region of the flexible printed circuit board in which the first member and the second member are disposed is higher in rigidity than the second region located between the first member and the second member. That is, the flexible printed circuit board of the present invention includes a region that is higher in rigidity than the second region, between the first region and the second region. As a result, in the flexible printed circuit board of the present invention, when the second region is flexed, the end portion of the first region on the second region side is greater in curvature than the second region. Further, the flexible printed circuit board of the present invention does not require etching of the wiring pattern, and thus involves lower manufacturing cost than a conventional flexible printed circuit board.

Thus, the present invention can provide a flexible printed circuit board higher in flex resistance than a conventional flexible printed circuit board, and provide a joined body including such a flexible printed circuit board.

DESCRIPTION OF EMBODIMENTS

Figure 1:
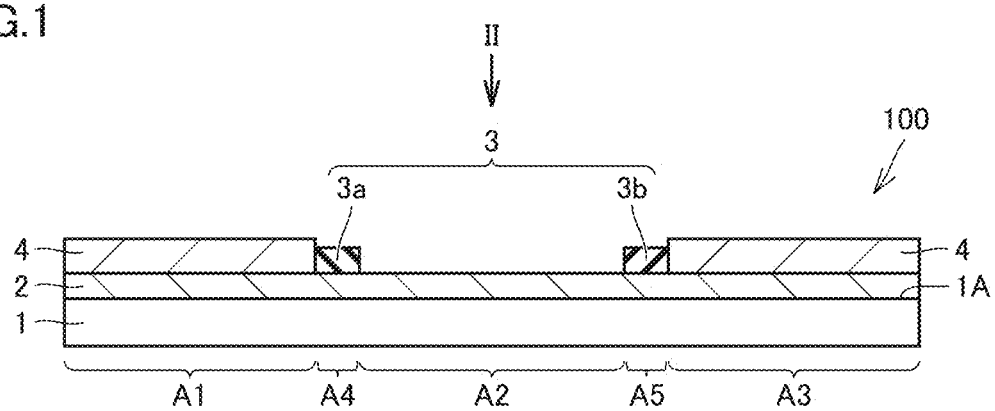
FIG. 1 is a cross-sectional view showing a flexible printed circuit board in embodiment 1.

Hereinafter embodiments of the present invention are described with reference to the drawings. In the drawings described below, identical or corresponding parts are identically denoted, and the explanation thereof is not repeated.

Embodiment 1

Configuration of Flexible Printed Circuit Board

Figure 2:
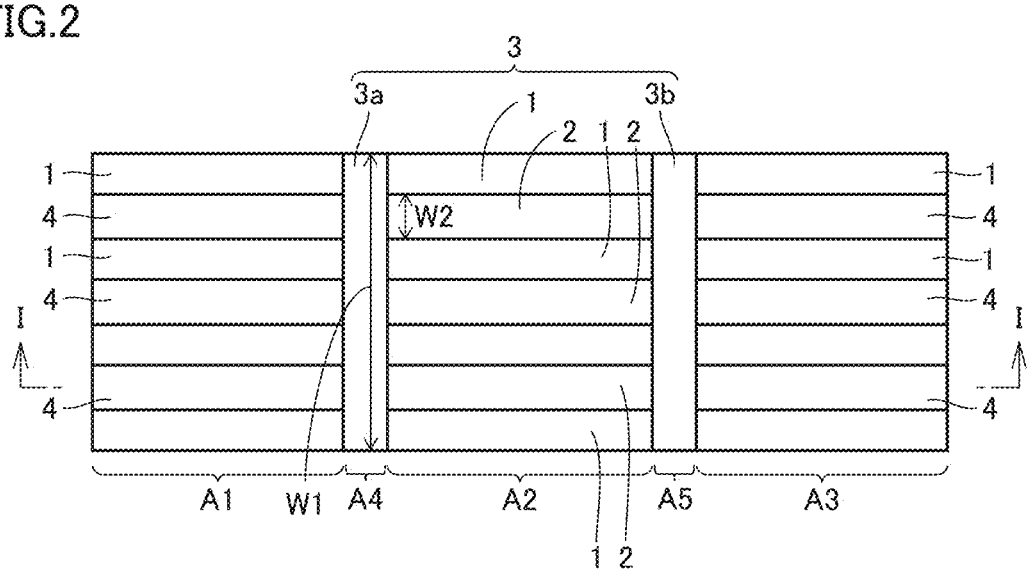
FIG. 2 is a plan view of the flexible printed circuit board shown in FIG. 1.

As shown in FIG. 1 and FIG. 2, a flexible printed circuit board 100 in embodiment 1 includes a base material 1, a first wiring pattern 2, a first member 3a, a second member 3b, and a solder layer 4.

As shown in FIG. 1, base material 1 is in the form of a film, for example. Base material 1 has a principal face 1A which is greater in area than the other faces. Hereinafter, the direction along principal face 1A and in which two members (e.g., substrates 90, 92 shown in FIG. 3) connected via flexible printed circuit board 100 are arranged is referred to as a first direction, the direction along principal face 1A and perpendicular to the first direction is referred to as a second direction, and the direction perpendicular to principal face 1A is referred to as a third direction. For each member, the width in the third direction is referred to as a thickness.

The width (thickness) of base material 1 in the third direction is, for example, not less than 12.5 μm and not more than 50 μm. The material constituting base material 1 may be any electrically insulating, flexible, and heat resisting material, such as a polymer material (e.g., polyimide).

As shown in FIG. 1, first wiring pattern 2 is formed on principal face 1A of base material 1. First wiring pattern 2 extends at least along the first direction. First wiring pattern 2 is formed on a first region A1, a second region A2, a third region A3, a fourth region A4, and a fifth region A5, which will be described later. First wiring pattern 2 has no steps, for example. The thickness of first wiring pattern 2 is substantially uniform in the first direction. In other words, a variation in thickness of first wiring pattern 2 in the first direction is not due to partial etching or the like, but due to the in-plane distribution caused by deposition. The thickness of first wiring pattern 2 is, for example, not less than 6 μm and not more than 70 μm. The width of first wiring pattern 2 is greater in the first direction than in the second direction. The material constituting first wiring pattern 2 may be any conductive material, such as a material including copper (Cu). First wiring pattern 2 may be bonded to base material 1 directly or via an adhesive (not shown), for example. In the former case, for example, a polyimide varnish is applied to a copper foil, and then the copper foil with the polyimide varnish is baked. This can produce base material 1 composed of polyimide, and can produce first wiring pattern 2 composed of copper foil and bonded to principal face 1A of base material 1. Alternatively, first wiring pattern 2 may be formed on principal face 1A of base material 1 by sputtering and plating, for example. In the latter case, for example, an epoxy resin adhesive or an acrylic resin adhesive may be used as an adhesive.

As shown in FIG. 2, a plurality of first wiring patterns 2 are disposed so as to be spaced from each other in the second direction, for example.

As shown in FIG. 1 and FIG. 2, first member 3a and second member 3b are disposed on first wiring pattern 2 so as to be spaced from each other in first direction A. First member 3a is spaced in the first direction from one end of first wiring pattern 2 in the first direction. Second member 3b is spaced in the first direction from the other end of first wiring pattern 2 in the first direction. In first direction A, first member 3a and second member 3b divide flexible printed circuit board 100 into five regions: first region A1, second region A2, third region A3, fourth region A4, and fifth region A5.

First region A1 is located opposite to second member 3b with respect to first member 3a. First region A1 is a region to be connected to a printed circuit board 90 (see FIG. 3) in a joined body 110 (described later). In first region A1, laminated are base material 1, first wiring pattern 2, and solder layer 4.

Second region A2 is disposed between first member 3a and second member 3b. Second region A2 is a region bending and connecting printed circuit board 90 to printed circuit board 92 with a so-called point-to-point construction in joined body 110 (described later). In second region A2, laminated are base material 1 and first wiring pattern 2. Second region A2 has no solder layer 4.

Third region A3 is disposed opposite to first member 3a with respect to second member 3b. Third region A3 is a region to be connected to printed circuit board 92 in joined body 110 (described later). In third region A3, laminated are base material 1, first wiring pattern 2, and solder layer 4.

Fourth region A4 is disposed between first region A1 and second region A2. Fourth region A4 is a region in which first member 3a is disposed. In fourth region A4, laminated are base material 1, first wiring pattern 2, and first member 3a.

Fifth region A5 is disposed between second region A2 and third region A3. Fifth region A5 is a region in which second member 3b is disposed. In fifth region A5, laminated are base material 1, first wiring pattern 2, and second member 3b.

As to the thickness of flexible printed circuit board 100, second region A2 is smaller in thickness than first region A1, third region A3, fourth region A4, and fifth region A5. First region A1 is equal in thickness to third region A3. First region A1 and third region A3 are greater in thickness than fourth region A4 and fifth region A5, for example.

As shown in FIG. 1, in the second direction, width W1 of first member 3a and second member 3b is preferably equal to or greater than width W2 of first wiring pattern 2. The material constituting first member 3a and second member 3b may be any material, preferably including a photosensitive material. If the material constituting first member 3a and second member 3b includes a photosensitive material, first member 3a and second member 3b may be formed by photolithography, for example.

As shown in FIG. 2, if a plurality of first wiring patterns 2 are disposed so as to be spaced from each other in the second direction, first member 3a and second member 3b preferably extend along the second direction to lie on and between the plurality of first wiring patterns 2. In this case, the material constituting first member 3a and second member 3b may be any material that is electrically insulating to such a degree as to prevent a short circuit between the plurality of first wiring patterns 2. The material is preferably a photo-curing or heat-curing material including, for example, a synthetic resin (e.g., epoxy resin). The material constituting first member 3a and second member 3b includes a photo-curing and heat-curing resin, such as an epoxy resin with an acrylic acid added thereto. First member 3a and second member 3b are preferably in contact with principal face 1A of base material 1 located between the plurality of first wiring patterns 2, and in contact with lateral faces of the plurality of first wiring patterns 2 extending along the first direction and the third direction. First member 3a and second member 3b may include relatively convex parts located on the plurality of first wiring patterns 2, and relatively concave parts located between the plurality of first wiring patterns 2.

First member 3a and second member 3b may be formed in the following way, for example. First, a photo-curing and heat-curing resin is applied to the whole of principal face 1A of base material 1 with first wiring pattern 2 formed thereon. Then, the coating film is exposed using a predetermined mask pattern. The exposed coating film is then heated to be cured. Then, the coating film is developed. First member 3a and second member 3b thus obtained are in the shape of predetermined patterns. Further, first member 3a and second member 3b, which have been cured, are higher in rigidity than if they were not cured.

The width (thickness) of first member 3a and second member 3b in the third direction is, for example, not less than 10 μm and not more than 100 μm.

First member 3a and second member 3b are provided for forming fourth and seventh regions A4 and A7 (see FIG. 3) and fifth and eighth regions A5 and A8 (see FIG. 3) on both sides of second region A2 in first direction A in joined body 110 (described later), the regions A4, A7, A5, and A9 being higher in rigidity than second region A2.

Solder layer 4 as a first joining member is disposed on first wiring pattern 2 in first region A1 and third region A3. Solder layer 4 is not disposed on first wiring pattern 2 in second region A2. Solder layer 4 is, for example, in contact with a lateral face of each of first member 3a and second member 3b extending along the third direction and the second direction. The material constituting solder layer 4 may be any commercially available alloy solder, such as an alloy solder including at least one selected from the group consisting of tin (Sb), lead (Pb), silver (Ag), and copper (Cu). Solder layer 4 is, for example, an eutectic solder containing Sb with 37% by weight of Pb, or a lead-free solder containing Sb with 3% by weight of Ag and 0.5% by weight of Cu. In the second direction, solder layer 4 is equal in width to first wiring pattern 2.

Solder layer 4 may be formed in the following way, for example. A paste solder member containing a flux (e.g., rosin) is applied to first wiring pattern 2 in first region A1 and third region A3. Any method may be used to apply the solder member. For example, printing with a metal mask, or application with a dispenser may be selected, depending on the required accuracy, the number of times of application or the like. Then, the solder member is melted by heat and wets and spreads over first region A1 and third region A3. At this time, first member 3a and second member 3b block the melted solder member from flowing out to second region A2. Then, the solder member is cooled to solidify. Solder layer 4 thus obtained is, for example, formed over the whole of first region A1 and the whole of third region A3.

The width (thickness) of solder layer 4 in the third direction is, for example, not less than 10 μm and not more than 100 μm. For example, the width of solder layer 4 is equal to or greater than the thickness of first member 3a and second member 3b, particularly, greater than the thickness of first member 3a and second member 3b. Solder layer 4 is designed with a thickness such that solder layer 4 will be in tight contact with a predetermined region of second wiring pattern 91 even if deformation, such as warp, occurs in printed circuit board 90. Also, solder layer 4 is designed with a thickness such that, when flexible printed circuit board 100 is connected to printed circuit boards 90, 92, the melted solder material will not come in contact with another first wiring pattern 2, another second wiring pattern 91, and another third wiring pattern 93 adjoining in the second direction.

Method for Manufacturing Flexible Printed Circuit Board

Flexible printed circuit board 100 may be manufactured in the following way, for example.

First, base material 1 in the form of a film is prepared. Then, first wiring pattern 2 is formed on principal face 1A of base material 1. Specifically, first wiring pattern 2 may be formed by, for example, depositing a wiring layer on the whole of principal face 1A of base material 1 by sputtering or plating, and then partially etching the wiring layer by photolithography. Then, first member 3a and second member 3b are formed on first wiring pattern 2 located in an intermediate region between first region A1 and second region A2, and in an intermediate region between third region A3 and second region A2. As described above, first member 3a and second member 3b are formed by, for example, applying a photo-curing and heat-curing resin to the whole of principal face 1A of base material 1, and then partially etching the applied resin by photolithography. Then, solder layer 4 is formed on first wiring pattern 2 located in first region A1 and second region A2. In this way, flexible printed circuit board 100 is manufactured.

Configuration of Joined Body

Figure 3:
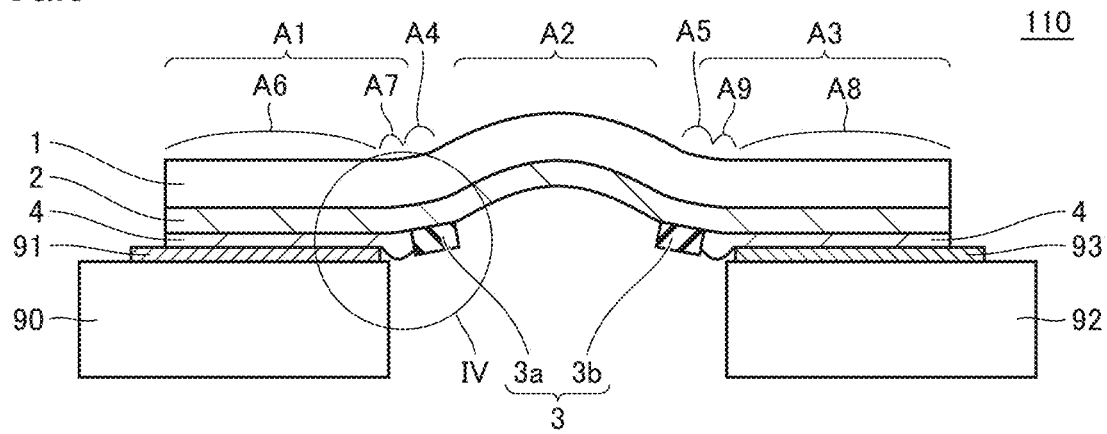
FIG. 3 is a cross-sectional view showing a joined body in embodiment 1.
Figure 4:
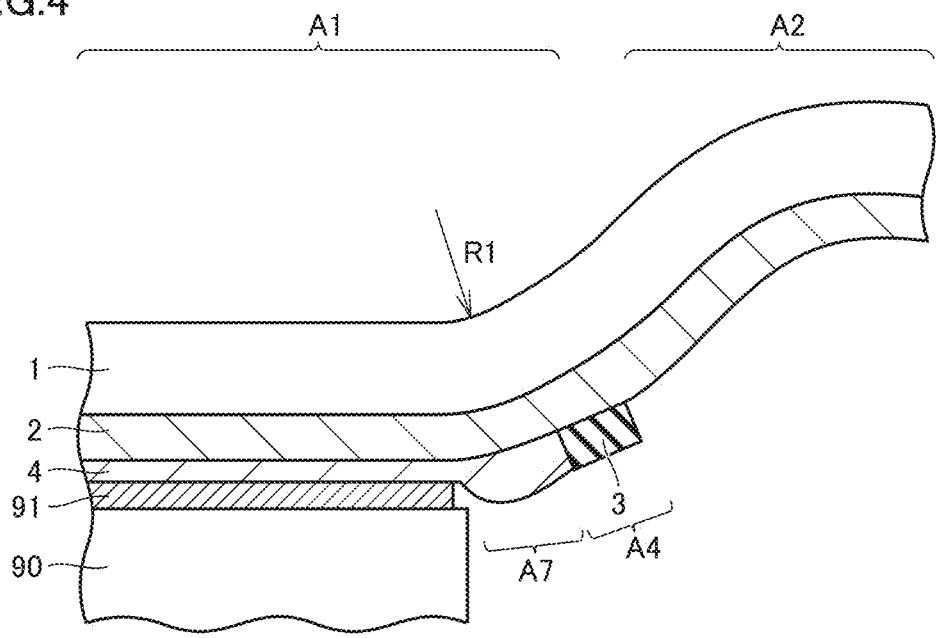
FIG. 4 is a partial cross-sectional view showing region IV in FIG. 3.
Figure 5:
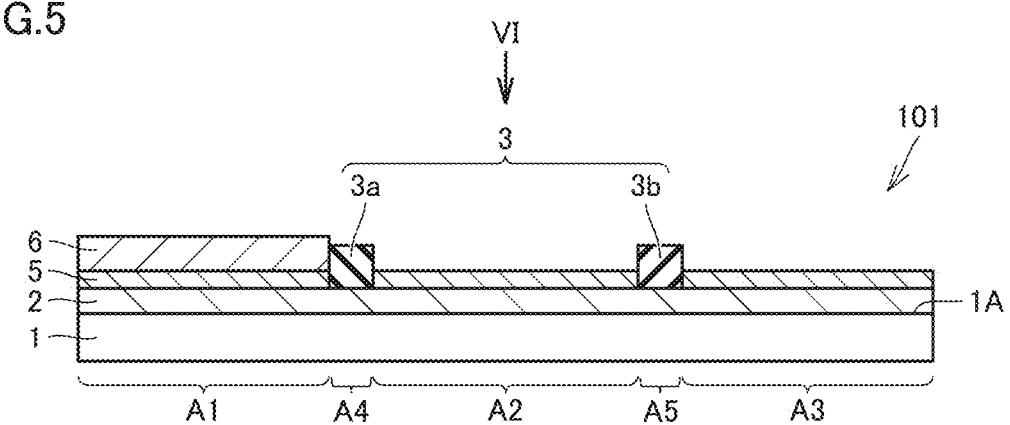
FIG. 5 is a cross-sectional view showing a flexible printed circuit board in embodiment 2.
Figure 6:
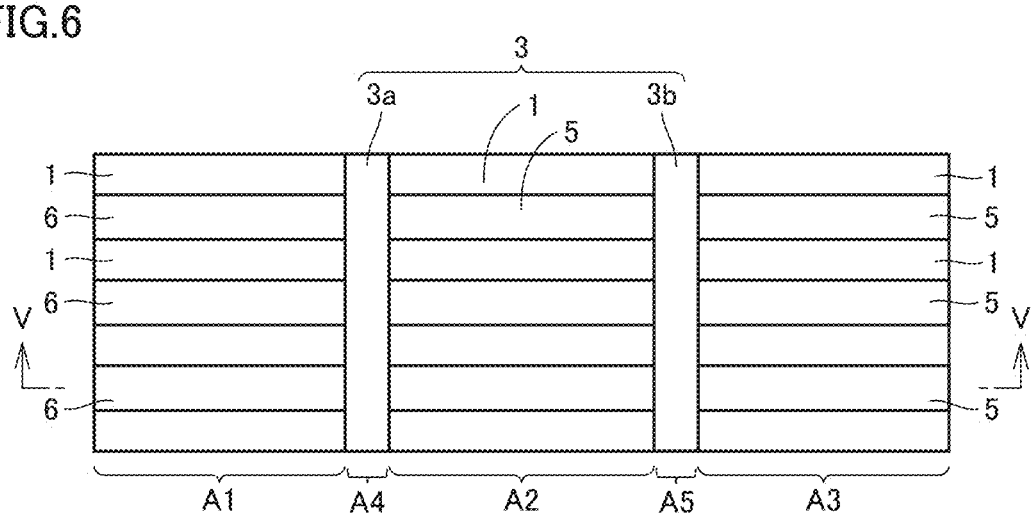
FIG. 6 is a plan view of the flexible printed circuit board shown in FIG. 5.

As shown in FIG. 3 and FIG. 4, joined body 110 includes flexible printed circuit board 100 shown in FIG. 1 and FIG.

2, and printed circuit board 90 (first substrate) and printed circuit board 92 (second substrate) electrically connected to each other via flexible printed circuit board 100.

Printed circuit board 90 includes second wiring pattern 91. Printed circuit board 92 includes third wiring pattern 93. Printed circuit boards 90, 92 may be any printed circuit board. Printed circuit boards 90, 92 may be formed in the following way, for example. A base material is formed by heat-curing a glass fiber impregnated with epoxy resin. Then, second wiring pattern 91 and third wiring pattern 93 composed of copper are formed on the base material. Printed circuit boards 90, 92 are, for example, equal in width (thickness) to each other in the third direction. The width (thickness) of second wiring pattern 91 and third wiring pattern 93 in the third direction may be designed based on the required current capacity and the manufacturing constraints, and is not less than 18 μm and not more than 70 μm, for example.

If flexible printed circuit board 100 includes a plurality of first wiring patterns 2, printed circuit board 90 includes a plurality of second wiring patterns 91, and printed circuit board 92 includes a plurality of third wiring patterns 93. Each of the plurality of second wiring patterns 91 and the plurality of third wiring patterns 93 is disposed so as to come in contact with a corresponding one of the plurality of first wiring patterns 2 in joined body 110.

As shown in FIG. 3 and FIG. 4, in joined body 110, a part of solder layer 4 of flexible printed circuit board 100 is joined to second wiring pattern 91 of printed circuit board 90 or third wiring pattern 93 of printed circuit board 92. Another part of solder layer 4 is not joined to second wiring pattern 91 or third wiring pattern 93.

From a different viewpoint, in joined body 110, first region A1 of flexible printed circuit board 100 includes a sixth region A6 in which solder layer 4 joined to second wiring pattern 91 is located, and a seventh region A7 in which solder layer 4 not joined to second wiring pattern 91 is located, as shown in FIG. 3. Seventh region A7 is disposed between sixth region A6 and fourth region A4 in which first member 3a is located. Sixth region A6 is a region spaced from first member 3a in first direction A. Seventh region A7 is a region in contact with first member 3a in first direction A.

Similarly, in joined body 110, third region A3 of flexible printed circuit board 100 includes an eighth region A8 in which solder layer 4 joined to third wiring pattern 93 is located, and a ninth region A9 in which solder layer 4 not joined to third wiring pattern 93 is located. Ninth region A9 is disposed between eighth region A8 and fifth region A5 in which second member 3b is located.

As shown in FIG. 3 and FIG. 4, in joined body 110, the maximum value of the thickness of solder layer 4 located in seventh region A7 and ninth region A9 is greater than the maximum value of the thickness of solder layer 4 located in sixth region A6 and eighth region A8. The thickness of solder layer 4 in joined body 110 is defined as the width of solder layer 4 in the direction perpendicular to the surface of first wiring pattern 2. When flexible printed circuit board 100 is joined to printed circuit boards 90, 92, the melted solder material receives a force in the third direction and thus spreads out in the first direction and the second direction. At this time, a flow of the melted solder material in the first direction is blocked by first member 3a and second member 3b. Accordingly, the maximum value of the thickness of solder layer 4 in seventh region A7 located on the first region A1 side relative to first member 3a in the first direction and in ninth region A9 located on the third region A3 side relative to second member 3b in the first direction is greater than the maximum value of the thickness of solder layer 4 located in sixth region A6 and eighth region A8. The thickness of solder layer 4 located in sixth region A6 and eighth region A8 is, for example, not less than 20 μm and not more than 50 μm. Solder layer 4 does not spread onto first member 3a and second member 3b, for example.

For example, if printed circuit boards 90, 92 are disposed on the same plane as shown in FIG. 3, second region A2 of flexible printed circuit board 100 is flexed such that the principal face 1A side is recessed. That is, the center of curvature of second region A2 is located on the side of printed circuit boards 90, 92 relative to flexible printed circuit board 100. With second region A2 flexing, in joined body 110, the shortest distance between first member 3a and second member 3b is shorter than the creepage distance on principal face 1A between first member 3a and second member 3b.

In joined body 110, second region A2 of flexible printed circuit board 100 is flexed. As shown in FIG. 3 and FIG. 4, in a cross section extending along the first direction and the third direction, the radius of curvature R1 of seventh region A7 and fourth region A4 (see FIG. 4) is greater than the radius of curvature of second region A2, and is smaller than the radius of curvature of first region A1 and third region A3.

In joined body 110, seventh region A7 and fourth region A4 of flexible printed circuit board 100 are smaller in curvature than second region A2.

Joined body 110 is manufactured in the following way, for example.

First, flexible printed circuit board 100 is manufactured based on the method for manufacturing flexible printed circuit board 100 as described above. Then, printed circuit boards 90, 92 are prepared. Then, solder layer 4 of flexible printed circuit board 100 is joined to second wiring pattern 91 of printed circuit board 90 and third wiring pattern 93 of printed circuit board 92. Specifically, the part of solder layer 4 that is spaced from first member 3a in first direction A is brought into contact with and pressed against second wiring pattern 91. Further, the part of solder layer 4 that is spaced from second member 3b in first direction A is brought into contact with and pressed against third wiring pattern 93. Thus, first wiring pattern 2 of flexible printed circuit board 100 is joined to second wiring pattern 91 and third wiring pattern 93 of printed circuit boards 90, 92, via solder layer 4. In this way, joined body 110 is manufactured.

If printed circuit boards 90, 92 are warped, they are preferably straightened by, for example, vacuum suction, before being connected to FPC substrate 100. By doing so, FPC substrate 100 does not easily deform along warps of printed circuit boards 90, 92 in joined body 110. Therefore, for example, if printed circuit board 90 is warped with its center being protruded or recessed relative to its both ends in the second direction, variations in curvature of second region A2 in the second direction can be minimized.

Advantageous Effects

Figure 15:
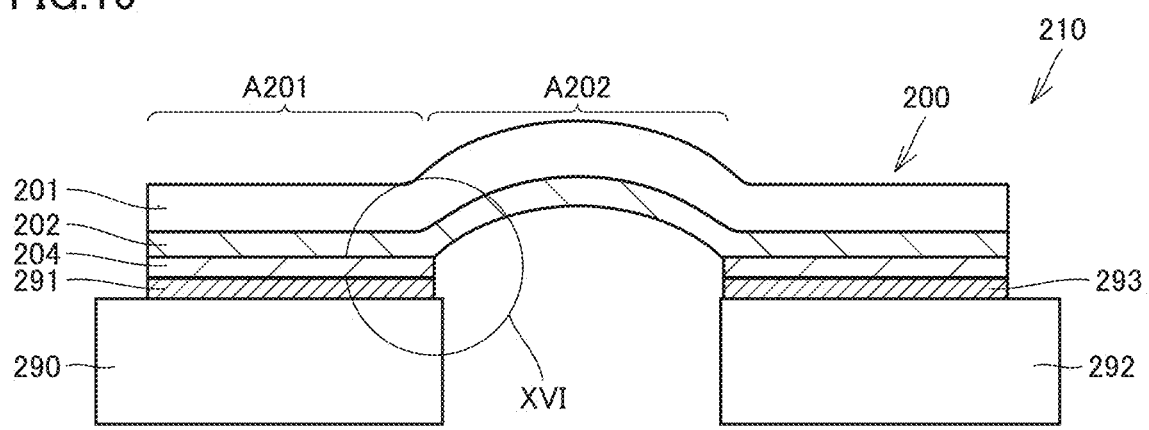
FIG. 15 is a cross-sectional view showing a conventional flexible printed circuit board.
Figure 16:
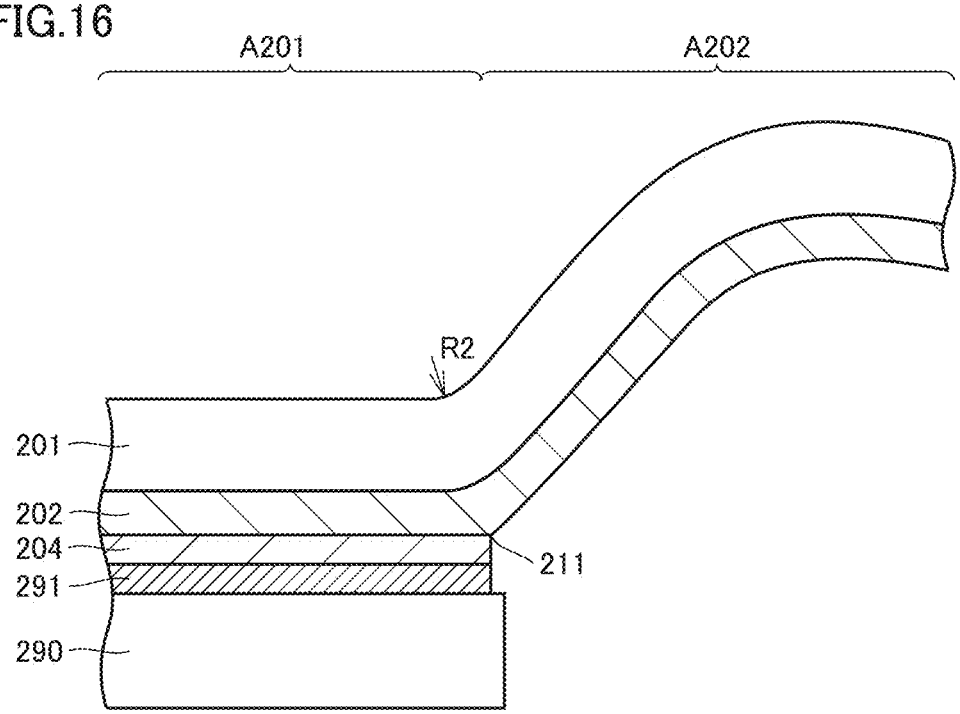
FIG. 16 is a partial cross-sectional view of the conventional flexible printed circuit board shown in FIG. 15.

As shown in FIG. 15 and FIG. 16, a conventional flexible printed circuit board 200 includes a base material 201 and a wiring pattern 202 disposed on base material 201. In a conventional joined body 210, a first region A201 of flexible printed circuit board 200 is joined to wiring patterns 291, 293 of printed circuit boards 290, 292 via a solder layer. Accordingly, if a strain arises between printed circuit boards 290, 292 in joined body 210, first region A201 cannot freely deform, and thus only a second region A202 adjoining first region A201 is flexed. At this time, the radius of curvature of second region A202 is uniformly reduced, and thus the radius of curvature changes substantially in a binary manner at the boundary portion 211 between the first region and the second region. Thus, the load due to the deformation is locally concentrated at boundary portion 211 between first region A201 and second region A202. It is generally known that the flex resistance of a substrate (the flex resistance of a conductor layer, in particular) is decreased as the radius of curvature is decreased. Therefore, in conventional flexible printed circuit board 200, the flex resistance of second region A202 does not satisfy the standard required for joined body 210.

As described above, the flexible printed circuit board described in PTL 1 also has this problem, as with flexible printed circuit board 200.

By contrast, flexible printed circuit board 100 includes: base material 1 including a principal face, at least one first wiring pattern 2 disposed on the principal face of base material 1 and extending along the first direction, first member 3a and second member 3b disposed on first wiring pattern 2 so as to be spaced from each other in the first direction, and solder layer 4 disposed on first wiring pattern 2 located in first region A1 of the flexible printed circuit board located opposite to second member 3b with respect to first member 3a. In the first direction, first member 3a and second member 3b divide flexible printed circuit board 100 into: first region A1 located opposite to second member 3b with respect to first member 3a in the first direction, second region A2 located between first member 3a and second member 3b, third region A3 located opposite to first member 3a with respect to second member 3b, fourth region A4 in which first member 3a is disposed, and fifth region A5 in which second member 3b is disposed. Second region A2 is smaller in thickness than fourth region A4 and fifth region A5.

In such a flexible printed circuit board 100, first member 3a is disposed in fourth region A4, second member 3b is disposed in fifth region A5, and second region A2 is smaller in thickness than fourth region A4 and fifth region A5. Accordingly, fourth region A4 and fifth region A5 are higher in rigidity than second region A2. As a result, in joined body 110 in which printed circuit board 90 and printed circuit board 92 are respectively joined to first region A1 and third region A3 of flexible printed circuit board 100, a strain arising between printed circuit boards 90, 92 will cause fourth region A4, second region A2, and fifth region A5 to be flexed. At this time, fourth region A4 and fifth region A5 are greater in curvature than second region A2. Therefore, the change in radius of curvature from first region A1 to second region A2 and from third region A3 to second region A2 is gentler in flexible printed circuit board 100 than in conventional flexible printed circuit board 200. As a result, second region A2 of flexible printed circuit board 100 is higher in flex resistance than that of conventional flexible printed circuit board 200.

In flexible printed circuit board 100, the material constituting first member 3a and second member 3b preferably includes a photosensitive material.

In the method for manufacturing a flexible printed circuit board in PTL 1, in order to control the rigidity of each of the bendable region and the non-bendable region, the residue of conductor layer in each region needs to be controlled through depositing a conductor layer by plating, masking the conductor layer, and etching the masked conductor layer. Further, in the method for manufacturing a flexible printed circuit board in PTL 1, the mask material needs to be removed after the etching. Accordingly, the flexible printed circuit board in PTL 1 disadvantageously involves increased manufacturing cost due to the increased manufacturing man-hour, as compared to flexible printed circuit board 200.

By contrast, in the method for manufacturing flexible printed circuit board 100, the difference in rigidity between second region A2 and fourth region A4 is created not by the difference in thickness of conductor layers (e.g., first wiring pattern 2) between the regions, but by the presence or absence of first member 3a and second member 3b. First member 3a and second member 3b can be easily formed by photolithography and are not removed. Therefore, flexible printed circuit board 100 involves lower manufacturing cost than the flexible printed circuit board in PTL 1.

In flexible printed circuit board 100, in plan view of the principal face, width W1 of first member 3a and second member 3b is equal to or greater than width W2 of first wiring pattern 2 in the second direction intersecting the first direction.

Thus, in the method for manufacturing flexible printed circuit board 100, the material that will be formed into the first and second joining members can be blocked from flowing from first region A1 or third region A3 into second region A2 along first wiring pattern 2. Further, in the method for manufacturing joined body 110, the first and second joining members can be blocked from flowing from first region A1 or third region A3 into second region A2 along first wiring pattern 2. Thus, in flexible printed circuit board 100 and joined body 110, none of the first and second joining members is disposed in second region A2, thus preventing the increase in rigidity of second region A2. As a result, in flexible printed circuit board 100 and joined body 110, second region A2 is highly bendable and can thus absorb a strain arising between printed circuit boards 90, 92.

Joined body 110 includes flexible printed circuit board 100, and printed circuit board 90 (first substrate) including second wiring pattern 91 joined to first wiring pattern 2 via solder layer 4. In joined body 110, first region A includes sixth region A6 (first joined region) in which solder layer 4 is joined to second wiring pattern 91, and seventh region A7 (first non-joined region) disposed between sixth region A6 and first member 3a in the first direction and not joined to second wiring pattern 91. A part of solder layer 4 is disposed on first wiring pattern 2 in seventh region A7.

Further, third region A3 includes eighth region A8 (second joined region) joined to third wiring pattern 93 via solder layer 4, and ninth region A9 (second non-joined region) disposed between eighth region A8 and second member 3b in the first direction and not joined to third wiring pattern 93. A part of solder layer 4 is disposed on first wiring pattern 2 in ninth region A9.

In such a joined body 110, seventh region A7, fourth region A4, second region A2, fifth region A5, and ninth region A9 of flexible printed circuit board 100 are configured as non-joined regions not joined to printed circuit boards 90, 92, and therefore can be flexed. Further, fourth region A4 and fifth region A5, in which first member 3a and second member 3b are respectively disposed as described above, are higher in rigidity than second region A2 located between first member 3a and second member 3b. Further, seventh region A7 and ninth region A9, in which a part of solder layer 4 is disposed, are higher in rigidity than second region A2 in which no solder layer 4 is disposed. Accordingly, when a force is applied to flexible printed circuit board 100, the non-joined regions other than the joined regions (sixth region A6 and eighth region A8) are deformed in accordance with their respective rigidities. As a result, joined body 110 can be deformed into different curvatures.

In joined body 110, in a cross section intersecting the principal face and along the first direction, flexible printed circuit board 100 in seventh region A7 and fourth region A4 (non-joined regions) is smaller in radius of curvature than the flexible printed circuit board in sixth region A6 (joined region), and is greater in radius of curvature than second region A2.

In such a joined body 110, the change in radius of curvature from third region A3 to second region A2 is gentler than that of conventional joined body 210. As a result, second region A2 of flexible printed circuit board 100 is higher in flex resistance than that of conventional flexible printed circuit board 200. Therefore, joined body 110 is more reliable than conventional joined body 210.

Embodiment 2

Configuration of Flexible Printed Circuit Board

As shown in FIG. 5 to FIG. 8, a flexible printed circuit board 101 in embodiment 2 is basically similar in configuration to flexible printed circuit board 100 in embodiment 1, but is different in that the second joining member is smaller in thickness than the first joining member. From a different viewpoint, flexible printed circuit board 101 is different from flexible printed circuit board 100 in that third region A3 is smaller in thickness than first region A1.

In flexible printed circuit board 101, the first joining member is made of a laminate in which a solder plating layer 5 (first conductive member) and a solder layer 6 (second conductive member) are laminated. The second joining member is made of solder plating layer 5 (first conductive member). In flexible printed circuit board 101, the first joining member is thicker than the second joining member by the thickness of solder layer 6. Base material 1 and first wiring pattern 2 are uniform in thickness in the first direction, for example. That is, in flexible printed circuit board 101, first region A1 is thicker than third region A3 by the thickness of solder layer 6.

Solder plating layer 5 is formed on first wiring pattern 2 in first region A1, second region A2, and third region A3. In the second direction, solder plating layer 5 is equal in width to first wiring pattern 2. The material constituting solder plating layer 5 may be any commercially available alloy solder, such as an alloy solder including at least one selected from the group consisting of tin (Sb), lead (Pb), silver (Ag), and copper (Cu). Solder plating layer 5 is, for example, an eutectic solder containing Sb with 37% by weight of Pb, or a lead-free solder containing Sb with 3% by weight of Ag and 0.5% by weight of Cu. Solder plating layer 5 may be formed by, for example, a plating process on first wiring pattern 2 having first member 3a and second member 3b formed thereon. The thickness of solder plating layer 5 may be controlled to be smaller than that of the above-described solder layer 4 through a plating process. If a plurality of first wiring patterns 2 are disposed so as to be spaced from each other in the second direction, a plurality of solder plating layers 5 are disposed so as to be spaced from each other in the second direction.

Solder plating layer 5 is designed with a thickness such that solder plating layer 5 will be in tight contact with a predetermined region of second wiring pattern 91 even if deformation, such as warp, occurs in printed circuit board 90. Also, solder plating layer 5 is designed with a thickness such that, when flexible printed circuit board 101 is connected to printed circuit boards 90, 92, the melted solder plating material will not come in contact with another first wiring pattern 2, another second wiring pattern 91, and another third wiring pattern 93 adjoining in the second direction. Solder plating layer 5 is disposed also in second region A2, and the total thickness of base material 1, first wiring pattern 2, and solder plating layer 5 is designed so as not to lose the flexibility of second region A2. For example, if third wiring patterns 93 have a thickness of not less than 6 μm and not more than 18 μm and are disposed at an interval of 0.2 mm in the second direction, the thickness of solder plating layer 5 may be not less than 10 μm and not more than 20 μm.

Solder layer 6 is formed on solder plating layer 5 on first wiring pattern 2 in first region A1. Solder layer 6 is not formed on first wiring pattern 2 in second region A2. Solder layer 6 is not formed on first wiring pattern 2 in third region A3.

Solder layer 6 may be configured similarly to the above-described solder layer 4. The thickness of solder layer 6 is greater than that of solder plating layer 5 and may be, for example, not less than 20 μm.

In flexible printed circuit board 101, in first region A1, base material 1, first wiring pattern 2, solder plating layer 5, and solder layer 6 are laminated in this order; in third region A3, base material 1, first wiring pattern 2, and solder plating layer 5 are laminated in this order; and in second region A2, base material 1, first wiring pattern 2, and solder plating layer 5 are laminated in this order.

Configuration of Joined Body

Figure 7:
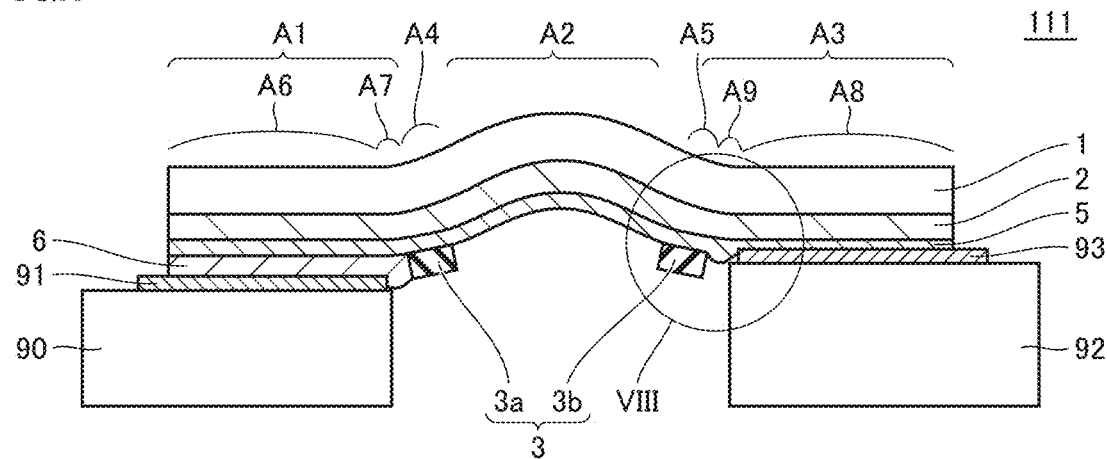
FIG. 7 is a cross-sectional view showing a joined body in embodiment 2.
Figure 8:
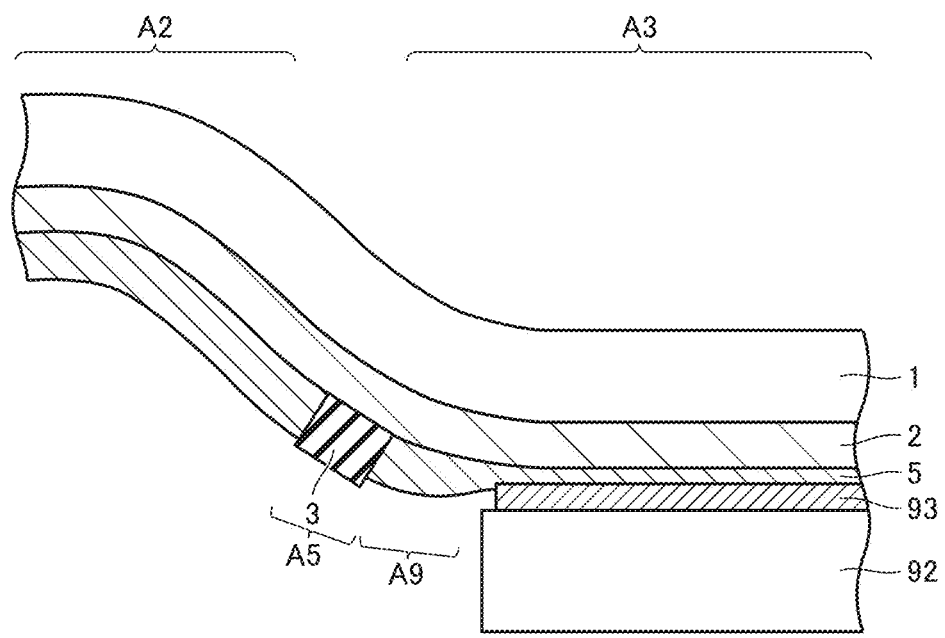
FIG. 8 is a partial cross-sectional view showing region VIII in FIG. 7.

As shown in FIG. 7 and FIG. 8, a joined body 111 in embodiment 2 is basically similar in configuration to joined body 110 in embodiment 1, but is different in that joined body 111 includes flexible printed circuit board 101 instead of flexible printed circuit board 100.

In joined body 111, solder layer 6 in first region A1 of flexible printed circuit board 101 is joined to second wiring pattern 91 of printed circuit board 90, and solder plating layer 5 in third region A3 is joined to third wiring pattern 93 of printed circuit board 92.

The thickness of third wiring pattern 93 is, for example, not less than 6 μm and not more than 18 μm. The base material of printed circuit board 92 is greater in thickness than the base material of printed circuit board 90, for example. Such a printed circuit board 92 can be manufactured by, for example, a known build-up process in which an insulating layer is laminated with a conductor pattern layer, the insulating layer being obtained by heat-curing a glass fiber impregnated with epoxy resin. Printed circuit board 92 may be manufactured by forming a conductor pattern on a glass substrate, or by forming a rewiring layer composed of a resin and a conductor on a silicon substrate. Alternatively, printed circuit board 92 may be manufactured by forming a conductor on a ceramic base material and then baking it.

As shown in FIG. 7 and FIG. 8, in joined body 111, the maximum value of the thickness of solder layer 6 located in seventh region A7 is greater than the maximum value of the thickness of solder layer 6 located in sixth region A6. Further, the maximum value of the thickness of solder plating layer 5 located in ninth region A9 is greater than the maximum value of the thickness of solder plating layer 5 located in eighth region A8. The maximum value of the thickness of solder plating layer 5 located in eighth region A8 is smaller than the maximum value of the thickness of solder plating layer 5 located in second region A2 and sixth region A6. When flexible printed circuit board 101 is joined to printed circuit boards 90, 92, the melted solder plating material receives a force in the third direction and thus spreads out in the first direction and the second direction. At this time, a flow of the melted solder plating material in the first direction is blocked by first member 3a and second member 3b. Accordingly, the maximum value of the thickness of solder plating layer 5 in seventh region A7 located on the first region A1 side relative to first member 3a in the first direction and in ninth region A9 located on the third region A3 side relative to second member 3b in the first direction is greater than the maximum value of the thickness of solder plating layer 5 located in sixth region A6 and eighth region A8.

When flexible printed circuit board 101 is joined to printed circuit boards 90, 92, the melted solder material receives a force in the third direction and thus spreads out in the first direction and the second direction. At this time, a flow of the melted solder material in the first direction is blocked by first member 3a and second member 3b. Accordingly, the maximum value of the thickness of solder layer 4 in seventh region A7 located on the first region A1 side relative to first member 3a in the first direction and in ninth region A9 located on the third region A3 side relative to second member 3b in the first direction is greater than the maximum value of the thickness of solder layer 4 located in sixth region A6 and eighth region A8. The thickness of solder layer 4 located in sixth region A6 and eighth region A8 is, for example, not less than 20 μm and not more than 50 μm. Solder layer 4 does not spread onto first member 3a and second member 3b, for example.

Advantageous Effects

Flexible printed circuit board 101, which is basically similar in configuration to flexible printed circuit board 100, can bring about advantageous effects similar to those of flexible printed circuit board 100.

Further, in flexible printed circuit board 101, solder plating layer 5 (first conductive member) is disposed on first wiring pattern 2 in first region A1, second region A2, and third region A3. Solder layer 6 (second conductive member) is disposed on solder plating layer 5 in first region A1. The second joining member includes solder plating layer 5. The first joining member includes solder plating layer 5 and solder layer 6. The first joining member is thicker than the second joining member by the thickness of solder layer 6.

When such a flexible printed circuit board 101 is joined to printed circuit boards 90, 92, the melted material of the second joining member spreads less widely than the melted material of the first joining member. Accordingly, the risk that the second joining member may cause a short circuit between a plurality of third wiring patterns 93 is lower than the risk that the first joining member may cause a short circuit between a plurality of second wiring patterns 91. That is, flexible printed circuit board 101 can prevent a short circuit between third wiring patterns 93 in joined body 111. In particular, for example, if the interval between third wiring patterns 93 in the second direction is shorter than the interval between second wiring patterns 91 in the second direction, or if third wiring patterns 93 are thicker than second wiring patterns 91, a short circuit between third wiring patterns 93 is prevented in joined body 111.

Variation

Figure 9:
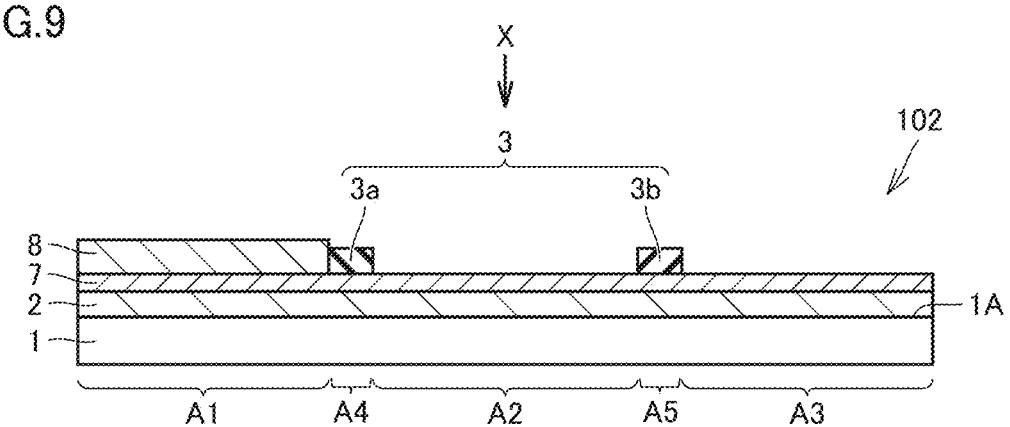
FIG. 9 is a cross-sectional view showing a variation of the flexible printed circuit board in embodiment 2.
Figure 10:
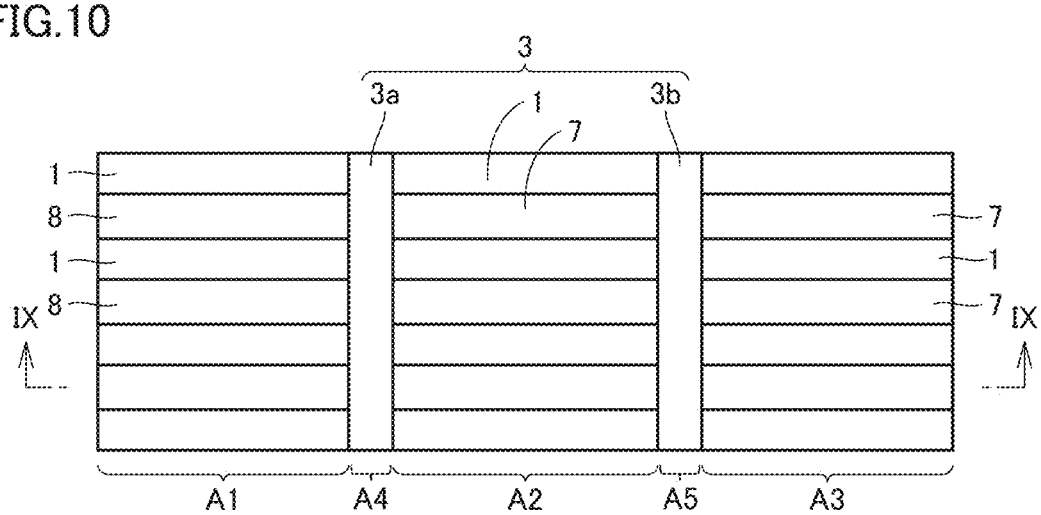
FIG. 10 is a plan view of the flexible printed circuit board shown in FIG. 9.

As shown in FIG. 9 and FIG. 10, a flexible printed circuit board 102 in a variation of embodiment 2 includes a plating layer 7 and a solder layer 8, instead of solder plating layer 5 and solder layer 6 in flexible printed circuit board 101. In flexible printed circuit board 102, the first joining member is made of plating layer 7 and solder layer 8. In flexible printed circuit board 102, the second joining member is made of plating layer 7.

The material constituting plating layer 7 may be any conductive material, such as a material including nickel (Ni) and gold (Au). Plating layer 7 may be a laminate in which a first layer composed of Ni and a second layer formed on the first layer and composed of Au are laminated, for example. The thickness of the first layer is, for example, not less than 2 μm and not more than 5 μm. The thickness of the second layer is, for example, not less than 0.01 μm and not more than 1.50 μm. Plating layer 7 is formed by plating. In the second direction, plating layer 7 is equal in width to first wiring pattern 2. If a plurality of first wiring patterns 2 are disposed so as to be spaced from each other in the second direction, a plurality of plating layers 7 are disposed so as to be spaced from each other in the second direction.

Solder layer 8 may be configured similarly to the above-described solder layer 4. The thickness of solder layer 8 is greater than that of plating layer 7 and may be, for example, not less than 20 μm. In the second direction, solder layer 8 is equal in width to first wiring pattern 2 and plating layer 7, for example.

First member 3a and second member 3b are disposed on plating layer 7, for example. That is, first member 3a and second member 3b may be formed after plating layer 7 is formed, for example. In this case, plating layer 7 and first member 3a are disposed on first wiring pattern 2 in the fourth region located between first region A1 and second region A2 in the first direction.

Figure 11:
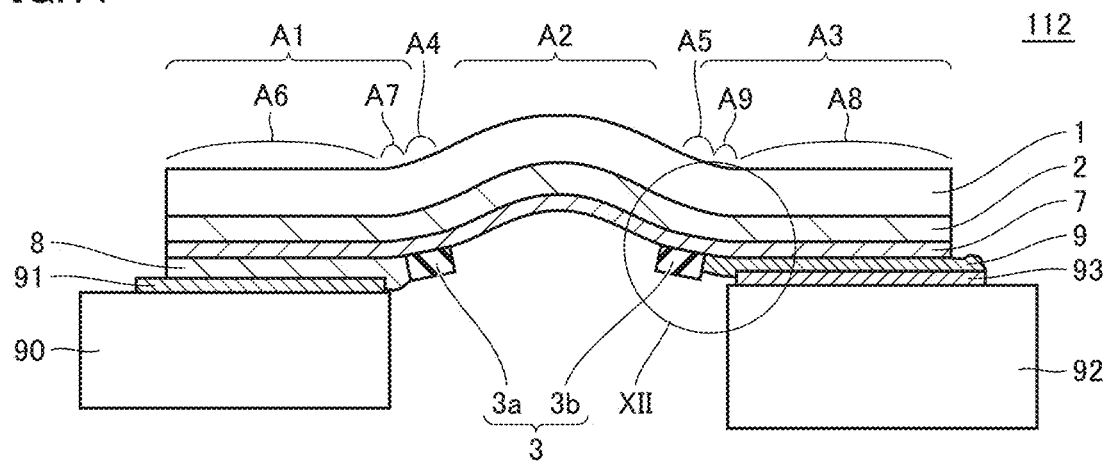
FIG. 11 is a cross-sectional view showing a variation of the joined body in embodiment 2.
Figure 12:
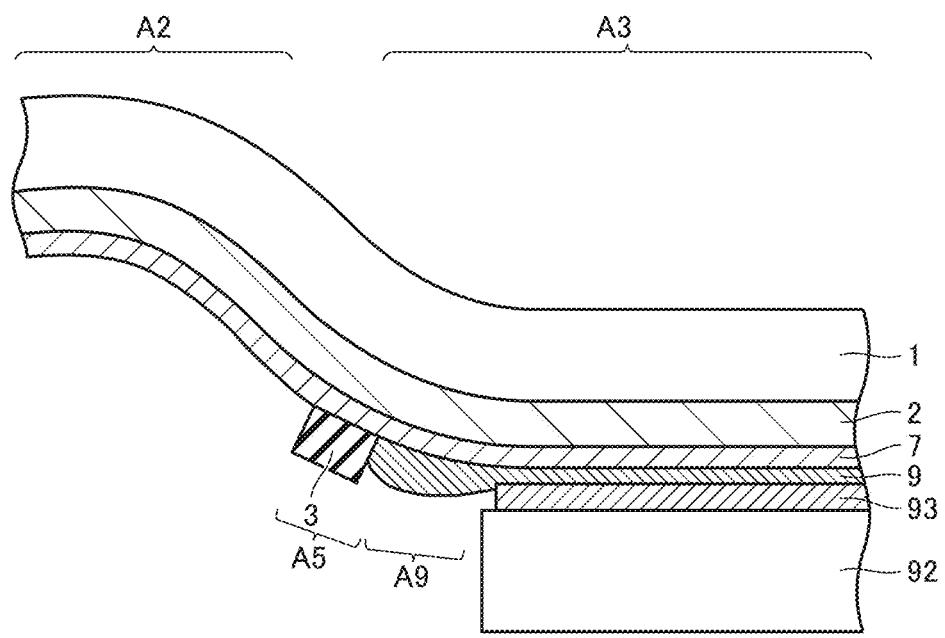
FIG. 12 is a partial cross-sectional view showing region XII in FIG. 11.

As shown in FIG. 11 and FIG. 12, in a joined body 112 having flexible printed circuit board 102, first wiring pattern 2 is joined to second wiring pattern 91 via plating layer 7 and solder layer 8 (first joining member). Further, in joined body 112, first wiring pattern 2 is joined to third wiring pattern 93 via plating layer 7 (second joining member) and adhesive 9 (third joining member).

Adhesive 9 may be any conductive adhesive, such as an anisotropic conductive adhesive. Adhesive 9 is smaller in thickness than solder layer 8, for example. Adhesive 9 is placed on a plurality of plating layers 7 before flexible printed circuit board 102 is joined to printed circuit boards 90, 92.

As shown in FIG. 11 and FIG. 12, in joined body 112, the maximum value of the thickness of solder layer 8 located in seventh region A7 is greater than the maximum value of the thickness of solder layer 8 located in sixth region A6. Further, the maximum value of the thickness of adhesive 9 located in ninth region A9 is greater than the maximum value of the thickness of adhesive 9 located in eighth region A8. The maximum value of the thickness of plating layer 7 located in eighth region A8 is, for example, equal to the maximum value of the thickness of plating layer 7 located in second region A2 and sixth region A6. When flexible printed circuit board 102 is joined to printed circuit boards 90, 92, the adhesive material receives a force in the third direction and thus spreads out in the first direction and the second direction. At this time, a flow of the adhesive material in the first direction is blocked by first member 3a and second member 3b. Accordingly, the maximum value of the thickness of adhesive 9 in seventh region A7 located on the first region A1 side relative to first member 3a in the first direction and in ninth region A9 located on the third region A3 side relative to second member 3b in the first direction is greater than the maximum value of the thickness of adhesive 9 located in sixth region A6 and eighth region A8.

Flexible printed circuit board 102 configured as described above, which is basically similar in configuration to flexible printed circuit board 101, can bring about advantageous effects similar to those of flexible printed circuit board 101.

First member 3a and second member 3b may be formed on first wiring pattern 2 before plating layer 7 is formed, for example. In other words, on first wiring pattern 2 in fourth region A4, only first member 3a may be disposed.

Flexible printed circuit board 102 may include a conductive layer formed by sputtering, instead of plating layer 7 formed by plating.

Embodiment 3

Figure 13:
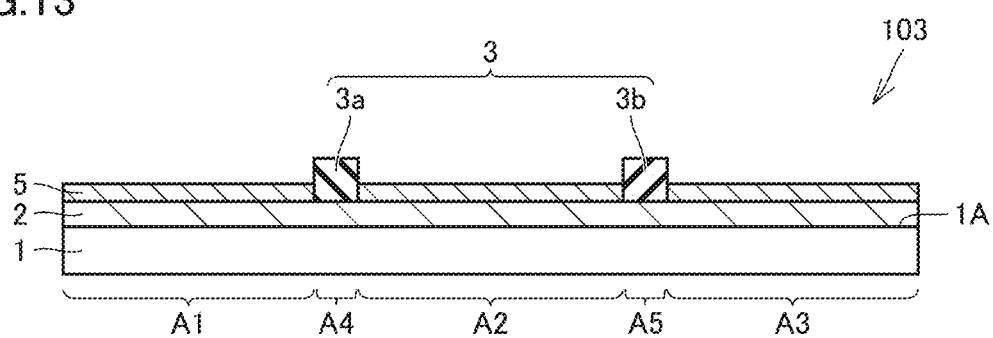
FIG. 13 is a cross-sectional view showing a flexible printed circuit board in embodiment 3.
Figure 14:
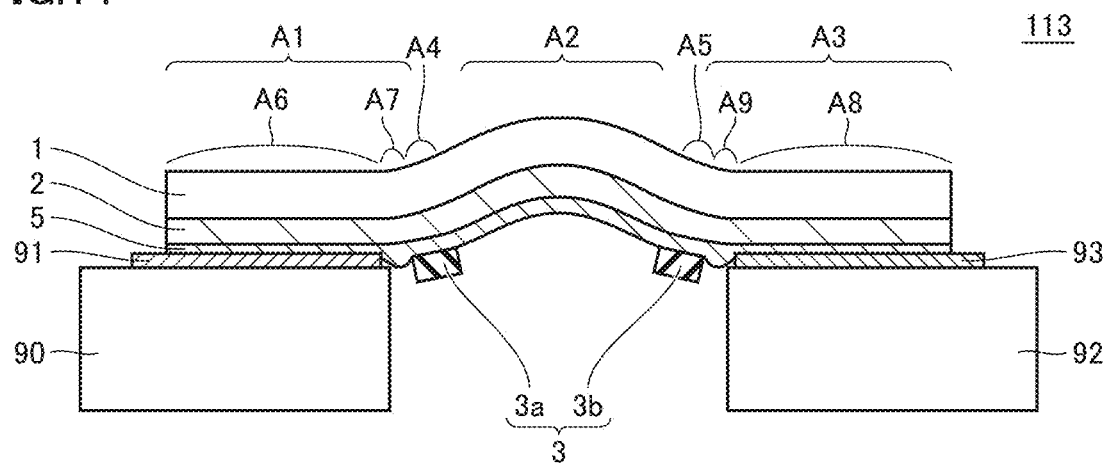
FIG. 14 is a cross-sectional view showing a joined body in embodiment 3.

As shown in FIG. 13 and FIG. 14, a flexible printed circuit board 103 in embodiment 3 is basically similar in configuration to flexible printed circuit board 100 in embodiment 1, but is different in that the thickness of second region A2 is equal to the thickness of each of first region A1 and third region A3. From a different viewpoint, flexible printed circuit board 103 is different from flexible printed circuit board 101 in embodiment 2 in that flexible printed circuit board 103 does not include solder layer 6.

As shown in FIG. 13 and FIG. 14, in flexible printed circuit board 103, the first conductive member and the second conductive member are the same in configuration, each of which is made of, for example, solder plating layer 5. Solder plating layer 5 is similar in configuration to solder plating layer 5 in flexible printed circuit boards 101, 102 in embodiment 2.

As shown in FIG. 13 and FIG. 14, a joined body 113 in embodiment 3 is basically similar in configuration to joined body 110 in embodiment 1, but is different in that joined body 113 includes flexible printed circuit board 103 instead of flexible printed circuit board 100.

In joined body 113, solder plating layer 5 in first region A1 of flexible printed circuit board 103 is joined to second wiring pattern 91 of printed circuit board 90, and solder plating layer 5 in third region A3 is joined to third wiring pattern 93 of printed circuit board 92.

Flexible printed circuit board 103, which is basically similar in configuration to flexible printed circuit board 100, can bring about advantageous effects similar to those of flexible printed circuit board 100.

Further, solder plating layer 5 which serves as the first and second joining members in flexible printed circuit board 103 is thinner than solder layer 4 which serves as the first and second joining members in flexible printed circuit board 100. Accordingly, when flexible printed circuit board 103 is joined to printed circuit boards 90, 92, the risk that the first and second joining members may cause a short circuit between a plurality of second wiring patterns 91 and between a plurality of third wiring patterns 93 is lower than that in flexible printed circuit board 100. That is, flexible printed circuit board 103 can prevent a short circuit between second wiring patterns 91 and between third wiring patterns 93 in joined body 113.

Embodiment 4

Configurations of Flexible Substrate and Joined Body

Figure 17:
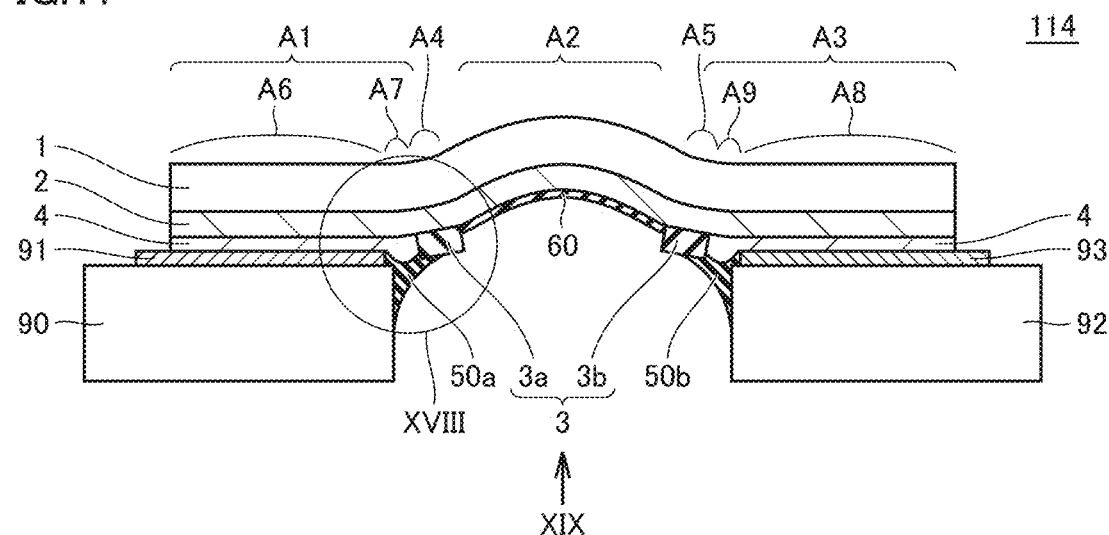
FIG. 17 is a cross-sectional view showing a joined body in embodiment 4.
Figure 18:
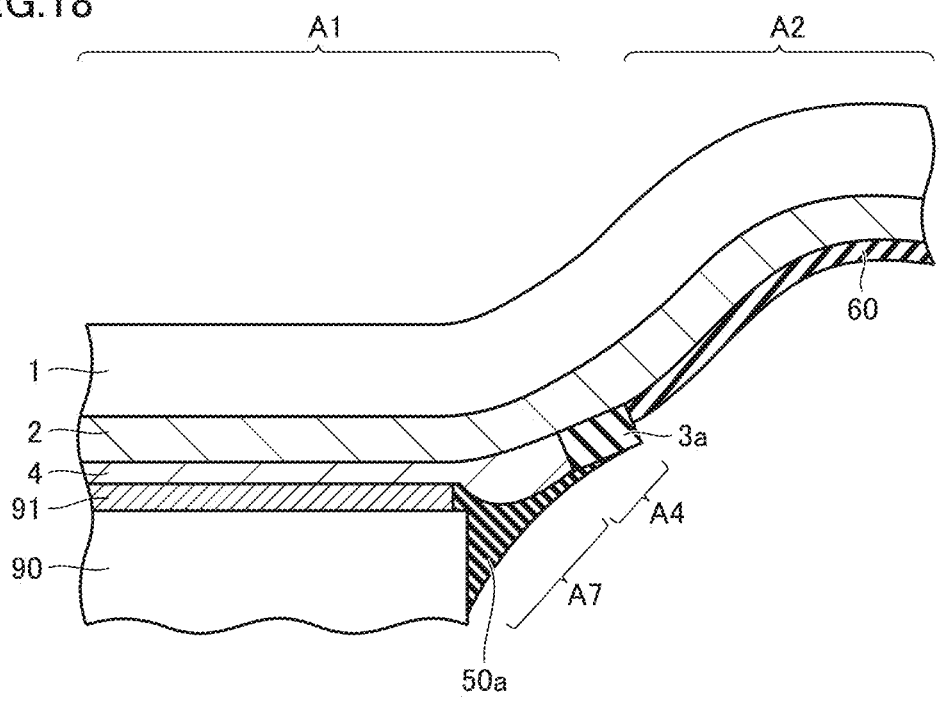
FIG. 18 is a partial cross-sectional view showing region XVIII in FIG. 17.
Figure 19:
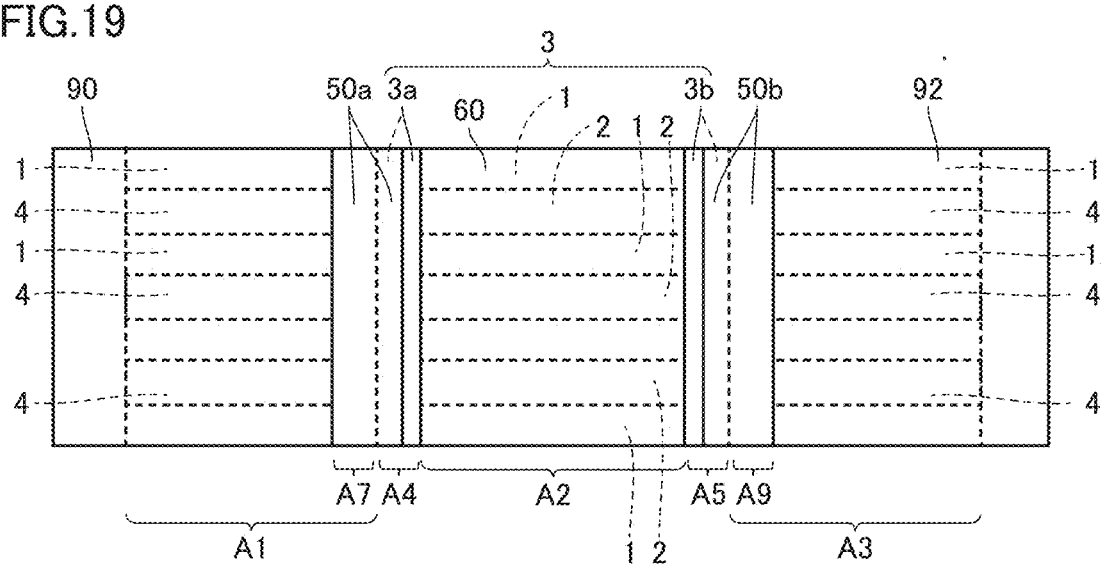
FIG. 19 is a plan view of the joined body shown in FIG. 17 as seen from the printed circuit board side.

As shown in FIG. 17 to FIG. 19, a joined body 114 in embodiment 4 is basically similar in configuration to joined body 110 in embodiment 1, but is different in that joined body 114 further includes a first reinforcing member 50a disposed on fourth region A4 and seventh region A7, a second reinforcing member 50b disposed on fifth region A5 and ninth region A9, and a third reinforcing member 60 disposed on second region A2.

Joined body 114 in embodiment 4 includes a flexible substrate 104. Flexible substrate 104 is basically similar in configuration to flexible printed circuit board 100 in embodiment 1 shown in FIG. 1 and FIG. 2, but is different in that flexible substrate 104 includes third reinforcing member 60.

As shown in FIG. 19 and FIG. 2, in first region A1 and third region A3 of flexible substrate 104, regions in which base material 1, first wiring pattern 2, and solder layer 4 are laminated; and regions in which only base material 1 is formed with no first wiring pattern 2 and solder layer 4 are alternately arranged in the second direction. In second region A2 of flexible substrate 104, regions in which base material 1 and first wiring pattern 2 are laminated; and regions in which only base material 1 is formed with no first wiring pattern 2 are alternately arranged in the second direction. A part of first member 3a faces second region A2 and is opposed to second member 3b in the first direction. A part of second member 3b faces second region A2 and is opposed to first member 3a in the first direction.

As shown in FIG. 17 and FIG. 18, a part of printed circuit board 90 and a part of second wiring pattern 91 face seventh region A7. A part of printed circuit board 92 and a part of third wiring pattern 93 face ninth region A9.

As shown in FIG. 17, first reinforcing member 50a and second reinforcing member 50b are disposed so as to be spaced from each other in the first direction. First reinforcing member 50a and second reinforcing member 50b are disposed with third reinforcing member 60 being interposed therebetween in the first direction. First reinforcing member 50a, second reinforcing member 50b, and third reinforcing member 60 extend along the second direction. First reinforcing member 50a covers at least the whole of seventh region A7 in the second direction. First reinforcing member 50a covers the whole of seventh region A7 and the part of fourth region A4 that is located on the seventh region A7 side in the first direction, for example. Second reinforcing member 50b covers at least the whole of ninth region A9 in the second direction. Second reinforcing member 50b covers the whole of ninth region A9 and the part of fifth region A5 that is located on the ninth region A9 side in the first direction, for example. Third reinforcing member 60 covers at least the whole of second region A2 in the second direction.

As shown in FIG. 17 and FIG. 18, first reinforcing member 50a covers the part of first member 3a that is located in fourth region A4, the part of solder layer 4 and base material 1 that is located in seventh region A7, and the part of printed circuit board 90 and second wiring pattern 91 that faces seventh region A7. Preferably, first reinforcing member 50a adheres tightly to the part of first member 3a that is located in fourth region A4, the part of solder layer 4 and base material 1 that is located in seventh region A7, and the part of printed circuit board 90 and second wiring pattern 91 that faces seventh region A7. As seen from the second direction, an exposed face of first reinforcing member 50a that is exposed to the outside connects smoothly between first member 3a and printed circuit board 90. As seen from the second direction, the exposed face is in the shape of a circular arc, and the center of curvature of the exposed face is located below first member 3a and on the second member 3b side relative to first member 3a.

As shown in FIG. 17, second reinforcing member 50b covers the part of second member 3b that is located in fifth region A5, the part of solder layer 4 and base material 1 that is located in ninth region A9, and the part of printed circuit board 92 and third wiring pattern 93 that faces ninth region A9. Preferably, second reinforcing member 50b adheres tightly to the part of second member 3b that is located in fifth region A5, the part of solder layer 4 and base material 1 that is located in ninth region A9, and the part of printed circuit board 92 and third wiring pattern 93 that faces ninth region A9. As seen from the second direction, an exposed face of second reinforcing member 50b that is exposed to the outside connects smoothly between second member 3b and printed circuit board 92. As seen from the second direction, the exposed face is in the shape of a circular arc, and the center of curvature of the exposed face is located below second member 3b and on the first member 3a side relative to second member 3b.

The width (thickness) of each of first reinforcing member 50a and second reinforcing member 50b in the third direction is, for example, not less than 1 mm and not more than 5 mm. First reinforcing member 50a is smaller in thickness in fourth region A4 than in seventh region A7. Second reinforcing member 50b is smaller in thickness in fifth region A5 than in ninth region A9.

The material constituting first reinforcing member 50a and second reinforcing member 50b may be any resin material that has, for example, at least any of ultraviolet-curing properties, heat-curing properties, and moisture-curing properties and has electrically insulating properties. For example, the material includes at least one selected from the group consisting of epoxy, acrylic, and polyurethane. Preferably, first reinforcing member 50a and second reinforcing member 50b have good adhesion to printed circuit boards 90, 92, second wiring pattern 91, solder layer 4, first member 3a, second member 3b, and base material 1. The material constituting first reinforcing member 50a may be the same as the material constituting second reinforcing member 50b.

As shown in FIG. 17 and FIG. 18, third reinforcing member 60 covers the part of first wiring pattern 2 and base material 1 that is located in second region A2, and the part of first member 3a and second member 3b that faces second region A2. Preferably, third reinforcing member 60 adheres tightly to the part of first wiring pattern 2 and base material 1 that is located in second region A2, and the part of first member 3a and second member 3b that faces second region A2.

Third reinforcing member 60 is equal to or lower than first reinforcing member 50a and second reinforcing member 50b in rigidity. Third reinforcing member 60 is smaller in thickness than first reinforcing member 50a and second reinforcing member 50b and may be, for example, not less than 0.01 mm and not more than 1.00 mm in thickness.

The thickness including base material 1, first wiring pattern 2, and third reinforcing member 60 in second region A2 is smaller than the thickness including base material 1, first wiring pattern 2, first member 3a, and first reinforcing member 50a in fourth region A4, and is smaller than the thickness including base material 1, first wiring pattern 2, solder layer 4, and first reinforcing member 50a in seventh region A7. The thickness of second region A2 is, for example, smaller than the thickness including base material 1, first wiring pattern 2, and first member 3a in fourth region A4.

The thickness including base material 1, first wiring pattern 2, and third reinforcing member 60 in second region A2 is smaller than the thickness including base material 1, first wiring pattern 2, second member 3b, and second reinforcing member 50b in fifth region A5, and is smaller than the thickness including base material 1, first wiring pattern 2, solder layer 4, and second reinforcing member 50b in ninth region A9. The thickness of second region A2 is, for example, smaller than the thickness including base material 1, first wiring pattern 2, and second member 3b in fifth region A5.

The material constituting third reinforcing member 60 may be any resin material that has, for example, at least any of ultraviolet-curing properties, heat-curing properties, and moisture-curing properties and has electrically insulating properties, such as a material including at least one selected from the group consisting of epoxy, acrylic, and polyurethane. For example, the material constituting third reinforcing member 60 includes at least one selected from the group consisting of epoxy, acrylic, and polyurethane. Preferably, third reinforcing member 60 has good adhesion to first wiring pattern 2, first member 3a, second member 3b, and base material 1. The material constituting third reinforcing member 60 may be the same as the material constituting first reinforcing member 50a and second reinforcing member 50b.

Method for Manufacturing Flexible Substrate and Joined Body

Flexible substrate 104 is manufactured by forming third reinforcing member 60 on flexible substrate 100 which has been manufactured by the above-described manufacturing method.

Specifically, first, flexible substrate 100 is prepared. Then, a mask member is formed so as to cover the region of flexible substrate 100 where third reinforcing member 60 will not be formed. Then, a liquid resin that will be formed into third reinforcing member 60 is deposited and cured on second region A2 of flexible substrate 100, thus forming third reinforcing member 60. Any known method may be selected for depositing third reinforcing member 60. Preferably, a method is selected that can easily deposit third reinforcing member 60 having a relatively small thickness as described above. Examples of such methods include application using a jet dispenser, electrostatic atomization, and screen printing. Any known method may be selected for curing third reinforcing member 60, such as ultraviolet curing, heat curing, or moisture curing. In this way, flexible printed circuit board 104 is manufactured.

Joined body 114 is manufactured by joining flexible substrate 104, which has been manufactured by the above-described method, to printed circuit boards 90, 92, and then forming first reinforcing member 50a and second reinforcing member 50b.

Specifically, first, solder layer 4 of flexible substrate 104 is joined to second wiring pattern 91 of printed circuit board 90 and third wiring pattern 93 of printed circuit board 92. Then, a liquid resin that will be formed into first reinforcing member 50a is deposited and cured on a predetermined region in fourth region A4 and seventh region A7 of flexible substrate 104, thus forming first reinforcing member 50a. Similarly, a liquid resin that will be formed into second reinforcing member 50b is applied to and cured on a predetermined region in fifth region A5 and ninth region A9 of flexible substrate 104, thus forming second reinforcing member 50b. First reinforcing member 50a and second reinforcing member 50b are formed simultaneously, for example. Any known method may be selected for depositing first reinforcing member 50a and second reinforcing member 50*b*, such as application using a jet dispenser or an air pressure dispenser. Any known method may be selected for curing first reinforcing member 50*a* and second reinforcing member 50*b*, such as ultraviolet curing, heat curing, or moisture curing. In this way, first reinforcing member 50*a* and second reinforcing member 50*b* are formed. At this time, the liquid-phase resin is cured preferably as being kept substantially in the shape of a circular arc shown in FIG. 18 by a surface tension acting on the liquid resin. In this way, first reinforcing member 50*a* and second reinforcing member 50*b* in the shape of a fillet as shown in FIG. 18 are formed.

Before applying a liquid resin that will be formed into first reinforcing member 50*a*, second reinforcing member 50*b*, and third reinforcing member 60, a surface treatment (e.g., oxygen plasma or corona discharge) may be performed on the region to which the liquid resin will be applied. For example, before applying a liquid resin that will be formed into third reinforcing member 60, the surface treatment may be performed on the part of base material 1 and first wiring pattern 2 that is located in second region A2, and the part of first member 3*a* and second member 3*b* that faces second region A2. Before applying a liquid resin that will be formed into first reinforcing member 50*a* and second reinforcing member 50*b*, a surface treatment (e.g., oxygen plasma or corona discharge) may be performed on the part of first member 3*a* that is located in fourth region A4, the part of second member 3*b* that is located in fifth region A5, the part of solder layer 4 and base material 1 that is located in seventh region A7 and in ninth region A9, the part of printed circuit board 90 and second wiring pattern 91 that faces seventh region A7, and the part of printed circuit board 92 and third wiring pattern 93 that faces ninth region A9. This improves adhesion to first reinforcing member 50*a*, second reinforcing member 50*b*, and third reinforcing member 60.

Advantageous Effects

Flexible substrate 104 and joined body 114 are basically similar in configuration to flexible printed circuit board 100 and joined body 110 in embodiment 1. Further, joined body 114 includes first reinforcing member 50*a*, second reinforcing member 50*b*, and third reinforcing member 60. Thus, seventh region A7, fourth region A4, second region A2, fifth region A5, and ninth region A9 of joined body 114 are higher in rigidity than those of joined bodies 110 to 113. Third reinforcing member 60 is equal to or lower than first reinforcing member 50*a* and second reinforcing member 50*b* in rigidity. Accordingly, the relationship between seventh region A7, fourth region A4, second region A2, fifth region A5, and ninth region A9 of joined body 114 in terms of rigidity is the same as the relationship between those of joined bodies 110 to 113. Therefore, flexible substrate 104 and joined body 114 are equal to or higher than flexible printed circuit board 100 and joined body 110 in flex resistance.

If a joined body includes third reinforcing member 60 but does not include first reinforcing member 50*a* and second reinforcing member 50*b*, the joined body is lower in flex resistance than joined bodies 110 to 113 in embodiments 1 to 3. Second region A2 of such a joined body is thicker than second region A2 of joined bodies 110 to 113 by the thickness of third reinforcing member 60. Accordingly, the second region A2 of the joined body is higher in rigidity than second region A2 of joined bodies 110 to 113. As a result, in a joined body that includes third reinforcing member 60 but does not include first reinforcing member 50*a* and second reinforcing member 50*b*, seventh region A7 and ninth region A9 may be lower in rigidity than second region A2 with third reinforcing member 60, fourth region A4 with first member 3*a*, and fifth region A5 with second member 3*b*. If a strain arises between printed circuit boards 90, 92 in such a joined body, seventh region A7 and ninth region A9 are smaller in curvature than second region A2, fourth region A4, and fifth region A5.

By contrast, joined body 114 includes first reinforcing member 50*a* and second reinforcing member 50*b*, in addition to third reinforcing member 60, thus allowing seventh region A7 and ninth region A9 to be higher in rigidity than second region A2. Accordingly, if second region A2 is flexed, seventh region A7 located on the second region A2 side in first region A1, and ninth region A9 located on the second region A2 side in third region A3 are greater in curvature than the second region. That is, seventh region A7, fourth region A4, second region A2, fifth region A5, and ninth region A9 of joined body 114 are higher in rigidity than those of joined bodies 110 to 113; and the relationship between seventh region A7, fourth region A4, second region A2, fifth region A5, and ninth region A9 of joined body 114 in terms of rigidity is the same as the relationship between those of joined bodies 110 to 113. Thus, joined body 114 is equal to or higher than joined bodies 110 to 113 in flex resistance.

Further, in joined body 114, first reinforcing member 50*a* covers at least the whole of fourth region A4 and the whole of seventh region A7 in the second direction. Second reinforcing member 50*b* covers at least the whole of fifth region A5 and the whole of ninth region A9 in the second direction. Third reinforcing member 60 covers at least the whole of second region A2 in the second direction.

Thus, first reinforcing member 50*a* can block first wiring pattern 2 and solder layer 4 formed in fourth region A4 and seventh region A7 from coming in contact with oxygen or moisture contained in the atmosphere in which joined body 114 is placed. This can minimize the corrosion of first wiring pattern 2 and solder layer 4. Also, first reinforcing member 50*a* can prevent a short circuit between first wiring patterns 2 adjoining in the second direction in fourth region A4 and seventh region A7.

Second reinforcing member 50*b* can block first wiring pattern 2 and solder layer 4 formed in fifth region A5 and ninth region A9 from coming in contact with oxygen or moisture contained in the atmosphere in which joined body 114 is placed. This can minimize the corrosion of first wiring pattern 2 and solder layer 4. Also, second reinforcing member 50*b* can prevent a short circuit between first wiring patterns 2 adjoining in the second direction in fifth region A5 and ninth region A9.

Third reinforcing member 60 can block first wiring pattern 2 formed in second region A2 from coming in contact with oxygen or moisture contained in the atmosphere in which joined body 114 is placed. This can minimize the corrosion of first wiring pattern 2. Also, third reinforcing member 60 can prevent a short circuit between first wiring patterns 2 adjoining in the second direction in second region A2. Thus, joined body 114 has a high environmental resistance.

As described above, joined body 114, which includes first reinforcing member 50*a*, second reinforcing member 50*b*, and third reinforcing member 60, is higher in environmental resistance than joined bodies 110 to 113 in embodiments 1 to 3.

Joined body 114 is simply required to include at least first reinforcing member 50*a* and second reinforcing member 50b. Even if joined body 114 includes first reinforcing member 50a and second reinforcing member 50b but does not include third reinforcing member 60, such a joined body 114 is still equal to or higher than joined bodies 110 to 113 in flex resistance and higher in environmental resistance than joined bodies 110 to 113.

In joined body 114, first reinforcing member 50a and second reinforcing member 50b are simply required to lie at least on seventh region A7 and ninth region A9. First reinforcing member 50a and second reinforcing member 50b do not necessarily have to lie on fourth region A4 and fifth region A5. In this case, the thickness including base material 1, first wiring pattern 2, and third reinforcing member 60 in second region A2 is smaller than the thickness including base material 1, first wiring pattern 2, and first member 3a in fourth region A4, and is smaller than the thickness including base material 1, first wiring pattern 2, and second member 3b in fifth region A5.

In joined body 114, first reinforcing member 50a may cover, for example, the whole of seventh region A7 and the whole of fourth region A4. Second reinforcing member 50b may cover, for example, the whole of ninth region A9 and the whole of fifth region A5. In this case, the thickness including base material 1, first wiring pattern 2, and third reinforcing member 60 in second region A2 may be, for example, equal to the thickness including base material 1, first wiring pattern 2, and first member 3a in fourth region A4, and equal to the thickness including base material 1, first wiring pattern 2, and second member 3b in fifth region A5. In such a joined body 114, the thickness including base material 1, first wiring pattern 2, and third reinforcing member 60 in second region A2 is smaller than the thickness including base material 1, first wiring pattern 2, first member 3a, and first reinforcing member 50a in fourth region A4, and is smaller than the thickness including base material 1, first wiring pattern 2, solder layer 4, and first reinforcing member 50a in seventh region A7. Also, the thickness including base material 1, first wiring pattern 2, and third reinforcing member 60 in second region A2 is smaller than the thickness including base material 1, first wiring pattern 2, second member 3b, and second reinforcing member 50b in fifth region A5, and is smaller than the thickness including base material 1, first wiring pattern 2, solder layer 4, and second reinforcing member 50b in ninth region A9. Therefore, joined body 114 is equal to or higher than joined bodies 110 to 113 in flex resistance.

In joined body 114, third reinforcing member 60 is simply required to cover at least the whole of second region A2. Third reinforcing member 60 may stretch to at least any of fourth region A4, fifth region A5, seventh region A7, and ninth region A9. However, if third reinforcing member 60 reaches solder layer 4 in sixth region A6 and eighth region A8, there is a risk that third reinforcing member 60 disposed in sixth region A6 and eighth region A8 may deteriorate the reliability in electrical connection between first wiring pattern 2 and second wiring pattern 91. Therefore, third reinforcing member 60 preferably does not stretch to sixth region A6 and eighth region A8.

Although embodiments of the present invention have been described, the above-described embodiments may be modified in various manners. Also, the scope of the present invention is not limited to the above-described embodiments. The scope of the present invention is defined by the terms of the claims, and is intended to include any modification within the meaning and scope equivalent to the terms of the claims.

REFERENCE SIGNS LIST

1: base material; 1A: principal face; 2: first wiring pattern; 3a: first member; 3b: second member; 4, 6, 8: solder layer; 5: solder plating layer; 7: plating layer; 9: adhesive; 50a: first reinforcing member; 50b: second reinforcing member; 60: third reinforcing member; 90, 92: printed circuit board; 91: second wiring pattern; 93: third wiring pattern; 100, 101, 102: flexible printed circuit board; 110, 111, 112: joined body

The invention claimed is:

1. A joined body comprising:
a flexible printed circuit board;
a first substrate; and
a second substrate,
the flexible printed circuit board including:
a base material including a principal face;
at least one first wiring pattern disposed on the principal face of the base material and extending along a first direction; and
a first member and a second member disposed on the first wiring pattern so as to be spaced from each other in the first direction,
in the first direction, the first member and the second member dividing the flexible printed circuit board into at least
a first region located opposite to the second member with respect to the first member in the first direction,
a second region located between the first member and the second member,
a third region located opposite to the first member with respect to the second member,
a fourth region in which the first member is disposed, and
a fifth region in which the second member is disposed,
a thickness including the base material and the first wiring pattern in the second region being smaller than a thickness including the base material, the first wiring pattern, and the first member in the fourth region, and being smaller than a thickness including the base material, the first wiring pattern, and the second member in the fifth region,
the flexible printed circuit board further including:
a first joining member disposed on the first wiring pattern in the first region; and
a second joining member disposed on the first wiring pattern in the third region,
the first substrate including a second wiring pattern joined to the first wiring pattern in the first region via a first joining member; and
the second substrate including a third wiring pattern joined to the first wiring pattern in the third region via a second joining member,
the first region including
a first joined region in which the first joining member is joined to the second wiring pattern, and
a first non-joined region disposed between the first joined region and the first member in the first direction, and not joined to the second wiring pattern,
a part of the first joining member being disposed on the first wiring pattern in the first non-joined region,
the third region including
a second joined region in which the second joining member is joined to the third wiring pattern, and
a second non-joined region disposed between the second joined region and the second member in the first direction, and not joined to the third wiring pattern, a part of the second joining member being disposed on the first wiring pattern in the second non-joined region,
the first wiring pattern in the second region being flexed,
a center of curvature of the second region being located on a side of the first substrate and the second substrate relative to the flexible printed circuit board.

2. The joined body according to claim 1, wherein
the second joining member is thinner than the first joining member.

3. The joined body according to claim 1, wherein
a first conductive member is disposed on the first wiring pattern in the first region, the second region, and the third region,
a second conductive member is disposed on the first conductive member in the first region,
the second joining member includes the first conductive member,
the first joining member includes the first conductive member and the second conductive member, and
the first joining member is thicker than the second joining member by a thickness of the second conductive member.

4. The joined body according to claim 1, wherein
a material constituting the first member and the second member includes a photosensitive material.

5. The joined body according to claim 1, wherein
in plan view of the principal face, the first member and the second member are equal to or greater than the first wiring pattern in width in a second direction intersecting the first direction.

6. The joined body according to claim 1, wherein
in a cross section intersecting the principal face and along the first direction, the first non-joined region of the flexible printed circuit board is smaller in radius of curvature than the first joined region of the flexible printed circuit board, and is greater in radius of curvature than the second region.

7. The joined body according to claim 1, further comprising:
a first reinforcing member disposed on the first joining member at least in the first non-joined region.

8. The joined body according to claim 7, further comprising:
a second reinforcing member disposed on the second joining member at least in the second non-joined region.

9. The joined body according to claim 8, further comprising:
a third reinforcing member disposed on the first wiring pattern in the second region.

10. The joined body according to claim 9, wherein
a thickness including the base material, the first wiring pattern, and the third reinforcing member in the second region is smaller than a thickness including the base material, the first wiring pattern, the first joining member, and the first reinforcing member in the first non-joined region, and is smaller than a thickness including the base material, the first wiring pattern, the second joining member, and the second reinforcing member in the second non-joined region.

11. The joined body according to claim 10, wherein
the first reinforcing member covers at least a whole of the first non-joined region in a second direction intersecting the first direction,
the second reinforcing member covers at least a whole of the second non-joined region in the second direction, and
the third reinforcing member covers at least a whole of the second region in the second direction.

12. The joined body according to claim 1, wherein
a thickness of the first region and the third region of the flexible printed circuit board are greater than a thickness of the fourth region and the fifth region of the flexible printed circuit board.

13. The joined body according to claim 1, wherein
a thickness of the first joining member is equal to or greater than a thickness of the first member and the second member.

* * * * *